Jan. 10, 1961 E. W. PLESSER ET AL 2,967,979

ELECTRICAL CONNECTION FOR PRINTED WIRING PANEL

Filed Jan. 20, 1956

INVENTORS
EDGAR W. PLESSER
HENRY W. SEHER

BY Carl H. Lynnestvedt
AGENT 2,967,979

ELECTRICAL CONNECTION FOR PRINTED WIRING PANEL

Edgar W. Plesser, Glenside, and Henry W. Seher, Elkins Park, Pa., assignors to Philco Corporation, Philadelphia, Pa., a corporation of Pennsylvania Filed Jan. 20, 1956, Ser. No. 560,398

2 Claims. (Cl. 317—101)

The invention herein described and claimed relates generally to electrical circuit constructions and pertains more particularly to circuit structures in which provision is made for electrical connection to ground. Specifically the invention has to do with electrical connections which, although suitable for use with various kinds of electrical equipment, are especially useful when employed as means for establishing ground connections between metallic chassis and so-called "printed" wiring circuits of the variety currently incorporated in radio and television receivers.

According to present practice, printed circuits as used in radio and television receiving equipment, comprise thin flat portions or strips of conductive material arranged in a predetermined pattern on one side of a supporting panel of non-conductive material. Circuit components are mounted on the other side of the panel and have leads which pass through the panel and are soldered to appropriate connection points in the printed wiring. As is customary, the printed wiring is connected to ground by establishing electrical connections between said wiring and the chassis of the receiver. However, the provision of good and efficient ground connections has given rise to complexities and problems mainly because ground connections made by following heretofore known procedures, in most instances, prove to be unsatisfactory. For that reason it is necessary to have recourse to unusual procedures which require complicated coupling means and additional processing operations.

Accordingly, it is an object of the present inventon to overcome the above mentioned complexities and problems by providing a novel and simplified grounding technique, whereby satisfactory ground connection between the printed wiring and metallic chassis of radio and television receivers is readily obtained without use of intricate coupling means and without involving unusual extrinsic operations.

It is also an object of the present invention to provide an improved arrangement for establishing connections between printed wiring panels and metallic chassis of radio and television receivers, the arrangement being such that it eliminates the use of clips, clamps, binding posts and other similar connectors, heretofore utilized for connecting to ground.

A characteristic feature of the invention resides in the provision of a printed wiring panel incorporating novel means adapted to connect the panel to ground simply by cooperative function of parts normally employed in securely affixing the panel onto the chassis.

The invention is further characterized in that the novel arrangement makes possible the automatic application of ground-connecting means on the printed wiring during dipping of the panel in a mloten solder bath.

Generally stated, the above noted objects and features of the invention are achieved by means of localized jutting deposits of solder or like conductive malleable material. These deposits project between areas of printed wiring portions and of parts of a conductive body adapted to serve as a return conductor so that, upon forced application of fastening elements employed to mount the panel on said body, said malleable material is caused to cold-flow and to effect intimate face-to-face contact between said printed wiring portions and said parts of the conductive body.

According to a specific embodiment of the invention, the solder deposits are in the form of peaked protuberances bulging from the surface of the printed wiring panel. These protuberances are relatively spaced about mounting holes in said panel and are located in the immediate vicinity of said mounting holes.

In a more subordinate aspect, the invention includes novel and advantageous features of construction, combination and arrangement of parts, all of which will be fully set forth hereinafter.

As indicated hereinabove, the arrangement contemplated by the present invention may be utilized with various types of devices. However, because the principles of the invention are particularly applicable to radio or television receiving equipment, the specific embodiment herein given by way of example, is illustrated and will be described in connection with such equipment. Accordingly, in the accompanying drawing.

Figure 1:
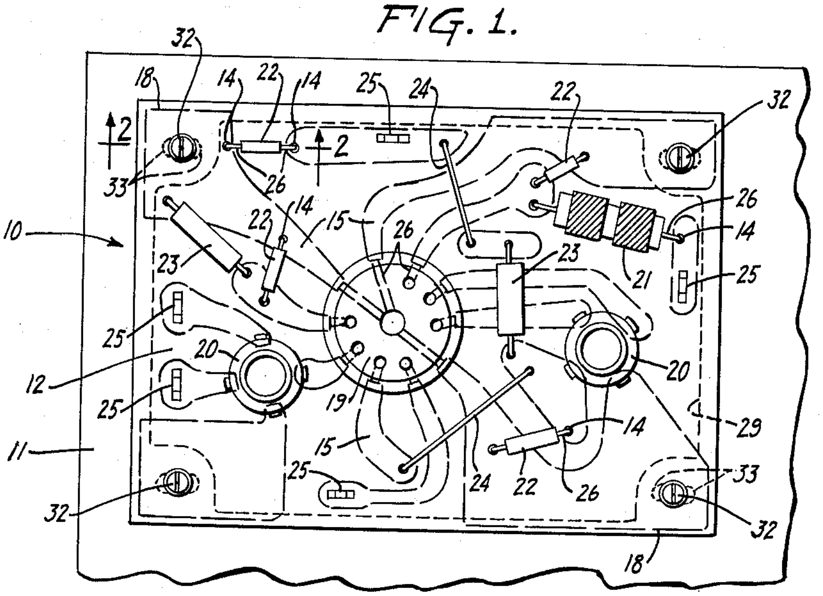
Figure 1 is a plan view of a portion of a television chassis having a printed wiring panel which incorporates the invention.

Having more particular reference to the drawing, there is illustrated a printed wiring assembly 10 mounted on a chassis 11. The printed wiring assembly is of a generally known variety which includes a base with electronic components on one side and circuit conductive paths on the other side.

Figure 2:
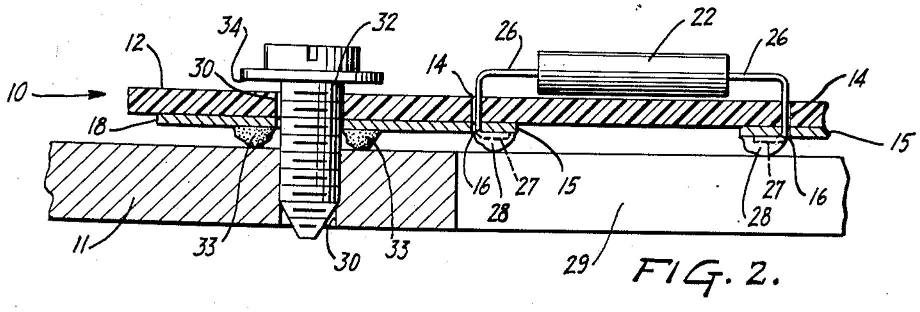
Figure 2 is an enlarged fragmentary sectional view taken approximately on line 2—2 of Figure 1 and illustrates associated parts prior to securely affixing the panel onto the chassis.
Figures 3, 4:
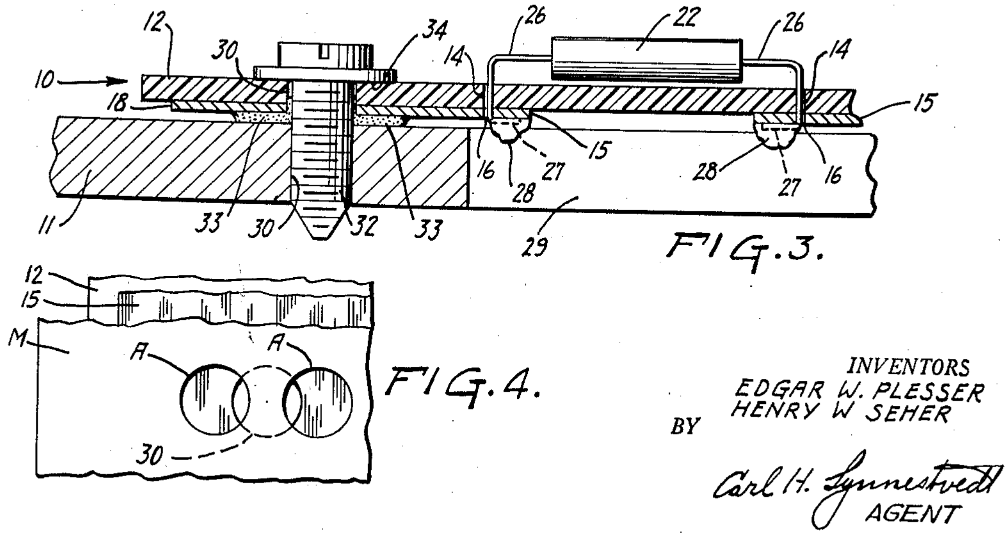
Figure 3 is a view similar to Figure 2 and illustrates the parts subsequent to securely affixing the panel onto the chassis.
Figure 4 is a fragmentary perspective view of a portion of a mask which may be used with a printed wiring panel, in practicing the invention.

The base of said assembly is of conventional type, being in the form of a panel 12 of non-conductive material, such as phenolic plastic or synthetic resin board. As shown, perforations 14 for receiving component leads are interspersed throughout the panel in accordance with a predetermined circuit diagram to permit passage of the component leads through the panel and to provide for connection of said leads with the aforesaid circuit conductive paths. The pattern of circuit conductive paths is represented by interrupted lines in Figure 1 and are constituted by means of thin, flat conductive strips 15 which, as appears in Figures 2 and 3 are affixed to the normal bottom surface of the panel 12.

The formation of the "printed" conductive strips on the mentioned side of the panel, is accomplished by any known suitable process, as for example by etching, electrodeposition, or the like, and said strips are made to conform to a predetermined pattern so that they electrically link proper electronic components to complete the circuit. For that purpose, as seen in Figures 2 and 3, the conductive strips have perforated portions 16 which register with the lead-receiving perforations 14 in the panel 12. In accordance with the present invention, certain of the conductive strips have portions 18 which are expanded to extend about and in close proximity to the marginal edges of the panel, for the purpose to be hereinafter set forth.

The circuit components which overlie the other or normal top surface of the panel 12 are of conventional types and, in the illustrated example of a part of a video IF circuit section of a television receiver, include such elements as a vacuum tube socket 19, IF coils 20, a detector coil 21, capacitors 22, resistors 23, crossover linking wires 24, and terminals 25 for connection with other circuit sections. These components have connecting means or leads 26 which pass through the appropriate perforations 14 in the panel 12 and through the corresponding perforated portions 16 in the conductive strips 15. The terminating end portions of the leads 26 are crimped over as shown at 27 in Figures 2 and 3 for electrical connection with said portions of the conductive strips by application of solder 28.

The application of solder may be done in any suitable known fashion. However, solder is most conveniently applied by dipping the panel 12 with the various components mounted thereon, in a solder bath so as to bring the face of a panel on which the conductive strips 15 and associated crimped lead portions 27 are disposed, in contact with molten solder. In practice, solder is applied only at those points where connections are desired, and this is advantageously attained by utilizing a mask having open areas located to overlie said points, in the manner described and claimed in the copending application of Edgar W. Plesser and George W. Hanmore, Serial No. 527,274 filed August 9, 1955, now Patent No. 2,916,805.

The chassis 11 for mounting the above described printed wiring assembly is of conventional construction, being stamped and formed to desired configuration from conductive metal sheet material. As shown, the portions of the chassis over which the panel 12 lies, has a generally rectangular opening 29 to clear the solder joints between the conductive portions 15 and the component crimped lead portions 27. The chassis opening 29 is of such a size with respect to the panel 12 that the marginal portions of said panel overlap those marginal portions of the chassis which define said opening 29. Said overlapping portions of the chassis and panel, at the places where the hereinabove mentioned expanded portions 18 of the conduction strip are located, contain holes 30 which, as clearly shown in Figures 2 and 3, are arranged in registry to receive fastening elements, such as tapping screws 32, for securely mounting the panel onto the chassis.

In particular accordance with the present invention, ground connection between the printed wiring and the chassis of the illustrated embodiment is assured by providing localized solder masses 33 on areas of said expanded conductive strip portions 18 adjacent the mounting holes therein. In this manner and as seen in Figure 2, the solder masses 33 firmly contact portions of the chassis adjoining the corresponding mounting holes thereof, and are disposed in direct alignment with the clamping surface 34 of the fastening element or screws 32. Thus, as presented in Figure 3, when said fastening elements or screws are driven home to set and secure the panel rigidly on the chassis, the force or pressure imposed upon the panel 12, causes the solder masses 33 to cold-flow and to spread between confronting portions of the printed wiring and chassis. As a result, cold solder is forced into pores, irregularities, crevices and like imperfections, which are likely to occur in processing the printed wiring assembly and its mounting chassis and, for that reason, it is assured that the printed wiring becomes intimately and firmly connected to ground through gas-free joints.

As represented in Figure 1, a pair of solder masses 33 is provided at each place where there is a mounting hole for effecting connection between the printed wiring and chassis, the paired masses being disposed approximately at diametrically opposite side of said mounting hole. As more clearly seen in Figure 2, the solder masses are in the form of generally globular or approximately conoidal knobs or protuberances. Solder masses disposed and formed, as above described, have the advantage that such masses first establish point contact with the chassis so that, under the pressure exerted by tightening of the mounting screws, gradually flowing and spreading out of the cold solder is enhanced and the danger of crumbling of the solder is effectively minimized.

In accordance with the invention, the solder masses 33 are advantageously formed during dip-soldering operation, and the formation of said masses is readily obtained through use of a mask of the kind hereinbefore noted. In practicing the present invention with such a mask, it is simply necessary, as represented in Figure 4, to provide the mask M with appropriately shaped open areas A at the places where the solder masses on the panel 12 are desired, that is, at places adjoining each mounting hole in said panel over which the mask is laid.

From the foregoing description, it will be appreciated that the invention provides a characteristically simple arrangement which will establish positive and reliable connection between printed wiring structures and conductive mounting bodies therefor. Although the invention has been shown and described with reference to a specific embodiment, it will be understood that this embodiment is susceptible of variations without departing from the gist of the invention. For example, and in the broader aspect of the invention, the solder masses which serve as means for effecting and assuring adequate connection of printed wiring to ground could be applied otherwise than by dip-soldering operation, as by utilization of hand-soldering irons, controlled solder-dropping devices or like conventional soldering contrivances. Also, said solder masses may have forms and shapes other than those hereinabove specified, and could be made as ridges, prominent rings or doughnut shaped projections, which could be arranged about the mounting holes in the printed wiring panel to serve the purpose of the invention.

We claim:

1. In an electrical circuit construction, the combination of a printed wiring panel having mounting apertures therein, conductive strips defining a circuit pattern on one face of said panel and including circuit grounding strips with portions disposed about and adjoining said apertures, a conductive chassis for mounting said panel, portions of said chassis confronting said grounding strip portions and having apertures in registry with said panel apertures, screw-threaded tightening fasteners passing through said registering apertures and having pressure-applying elements bearing on the other face of said panel about the openings therein, and solder masses carried by said grounding strip portions and disposed in engagement with said chassis portions, said masses being located in line with said pressure-applying elements and being compressed thereby through said tightening fasteners into spreading contact with said portions of said grounding strips and chassis.

2. In electrical circuit construction, the combination of a printed wiring panel having apertures adjacent its marginal edges, conductive strips defining a circuit pattern on one face of said panel and including grounding strips with portions disposed about said apertures, circuit components mounted on the other face of said panel and having leads passing through the latter, solder joints electrically coupling said component leads to said circuit pattern strips, a conductive chassis for mounting said panel and having an open area accommodating said soldered joints, portions of said chassis about said open area being arranged in confronting relation with respect to said grounding strip portions and having apertures in registry with said panel apertures, screw-threaded tightening fasteners passing through said panel apertures and in screw-threaded engagement with said chassis apertures, said fasteners having pressure-applying elements bearing on said other face of said panel about the openings therein, and solder masses carried by said grounding strip portions and disposed in engagement with said chassis portions, said masses being located in line with said pressure-applying elements and being compressed thereby through said tightening fasteners into spreading contact with said portions of said grounding strips and chassis.

References Cited in the file of this patent

UNITED STATES PATENTS

| | | |
|---|---|---|
| 1,963,692 | Clark | June 19, 1934 |
| 2,019,999 | Schellenger | Nov. 5, 1935 |
| 2,233,718 | Soreng | Mar. 4, 1941 |
| 2,244,264 | Seitz | June 3, 1941 |
| 2,262,791 | Bransford | Nov. 18, 1941 |
| 2,370,104 | Lazarus | Feb. 20, 1945 |
| 2,728,693 | Cado | Dec. 27, 1955 |
| 2,740,193 | Pessel | Apr. 3, 1956 |
| 2,756,485 | Abramson et al. | July 31, 1956 |
| 2,760,176 | Del Camp | Aug. 21, 1956 |

OTHER REFERENCES

Novak, W. D.: Tele-Tech, January 1953, page 64.